US005240882A

United States Patent [19]
Satoh et al.

[11] Patent Number: 5,240,882
[45] Date of Patent: Aug. 31, 1993

[54] PROCESS AND APPARATUS FOR MAKING DISCRETE TYPE SUBSTRATES BY RE-SLICING A WAFER

[75] Inventors: Tsutomu Satoh; Kouichi Nishimaki, both of Niigata, Japan

[73] Assignee: Naoetsu Electronics Co., Niigata, Japan

[21] Appl. No.: 921,466

[22] Filed: Jul. 28, 1992

Related U.S. Application Data

[63] Continuation of Ser. No. 367,041, Jun. 16, 1989, abandoned.

Foreign Application Priority Data

Jun. 28, 1988 [JP] Japan ................. 63-162043

[51] Int. Cl.$^5$ ............... H01L 21/302; H01L 21/304
[52] U.S. Cl. ................................ 437/226; 437/143; 83/906; 148/DIG. 12
[58] Field of Search ............ 437/226, 227, 141; 148/DIG. 28, DIG. 33

[56] References Cited

U.S. PATENT DOCUMENTS

| | | | |
|---|---|---|---|
| 3,247,576 | 4/1966 | Dill, Jr. et al. | 148/28 |
| 4,261,781 | 4/1981 | Edmonds et al. | |
| 4,610,079 | 9/1986 | Abe et al. | 148/28 |
| 4,771,759 | 9/1988 | Zoebeli | 51/73 |
| 5,024,867 | 6/1991 | Iwabachi | 437/160 |
| 5,073,517 | 12/1991 | Iwabachi | 437/955 |

FOREIGN PATENT DOCUMENTS

| | | | |
|---|---|---|---|
| 0099727 | 6/1984 | Japan | 437/141 |
| 64-30715 | 2/1989 | Japan | |
| 1-114044 | 5/1989 | Japan | |

*Primary Examiner*—Olik Chaudhuri
*Assistant Examiner*—Long Pham
*Attorney, Agent, or Firm*—Sandler Greenblum & Bernstein

[57] ABSTRACT

This invention relates to a process and an apparatus for making a substrate of a semiconductor of a monolithic silicon wafer, or the like, for use as a discrete element such as a transistor, diode, or the like. In particular, the invention is directed to re-slicing the silicon wafer into two further pieces, to dope impurity diffused layers on both sides but not to provide any impurity diffused layer in the core portion of the silicon wafer. The re-slicing process is performed from substantially the center portion of its core thickness of the wafer so as to provide each re-sliced surface as a plain surface without any impurity diffused layer and for doping a further new impurity diffused layer, so as to obtain two pieces of a substrate as discrete elements simultaneously from one piece of the wafer by the re-slicing process and apparatus of the invention.

10 Claims, 5 Drawing Sheets

PROCESS AND APPARATUS FOR MAKING DISCRETE TYPE SUBSTRATES BY RE-SLICING A WAFER

This application is a continuation of U.S. application Ser. No. 07/367,041, filed Jun. 16, 1989, now abandoned.

BACKGROUND OF THE INVENTION

1. Field of the Invention

The present invention relates to a process and an apparatus for making a substrate from a monolithic silicon wafer, and more particularly a substrate of a discrete element for use as a transistor, diode or the like.

2. Description of the Prior Art

Conventionally, it is known that such a substrate which is made from a single crystal Si-wafer (silicon wafer) has been used for various types of discrete elements such as a transistor, a pn-junction diode or the like.

As shown schematically in FIG. 9 to FIG. 11, a wafer 1 is sliced from a Si-ingot by a slicing saw having a blade core bonded with abrasive grains such as an industrial diamond or the like, and is then transferred to a thermal diffusion furnace for doping an impurity diffused layer 2 on both sides. The impurity layer may be composed of P(phosphorus), B(boron) or the like as the impurity compositions.

As a technical problem in the above doping process, however, it is noted that the above wafer 1 having the impurity diffused layers 2 on both sides is returned to a grinding process positioned upstream, and one side is ground by a grinding machine for removing that side's impurity layer in order to obtain a plain surface 3 without any impurity diffused layer. This feature is shown schematically in FIG. 10 wherein the reference letter G shows a grinding machine. According to this grinding process for a single side, a further impurity diffused layer 4 is doped on the plain surface 3 once again to provide a transistor, such as bipolar transistor which is doped with an emitter and base through those preparatory processes, such as etching, polishing, or the like, which are positioned upstream. After the completion of doping any new impurity 4 in the plain surface 3, the wafer is further transferred to a wiring station having a die. The above feature is shown schematically in FIG. 11.

In the above conventional process, since it is required to again grind on side of the wafer 1 to provide a wafer having both sides, that is, the plain surface 3 and the old surface 2 having an impurity diffused layer 2 on both sides, the problem is obvious that valuable silicon material is wasted as a grinding loss as well as the impurity diffused layer having to be doped a second time.

According to the prior art, Japanese Provisional Patent Application No. 64-30715 discloses a silicon block which consists of a plurality of silicon wafers stacked and bonded together in the shape of a Si-ingot, which is sliced by an ID (inner diameter) saw gradually at a predetermined thickness.

In this prior art device, however, despite the wafer being sliced with a predetermined thickness, the sliced wafer is formed as two pieces of the wafer and is bonded by an adequate bond but each are not a solid wafer. In addition, prior to the slicing process in this document, the wafer does not have any impurity diffusion layers in both sides. Therefore, it is clear that this document teaches a process for making a substrate of a pn-junction type element with a sintered layer sandwiched between two pieces of different kinds of wafers.

Accordingly, Japanese Provisional Patent Application No. 64-30715 does not discloses a process for making a substrate having an impurity diffused layer on one side and a plain surface without any impurity diffused layer on the other side of a Si-wafer, and also does not disclose a means for obtaining two pieces of substrates from one piece of a Si-wafer and also a means to re-slice a wafer at the center portion of its core thickness. These features will be described below as characteristics of the present invention.

In a comparison between both processes, Japanese Provisional Patent Application No. 64-30715 can obtain only one piece of a substrate for a pn-junction element from two pieces of a wafer as well as two substrates of pn-junction element from three pieces of a wafer.

In contrast, the present invention can obtain four pieces of a substrate of a pn-junction element from three pieces of a wafer. Thus, the technical objects and advantages of the present invention are quite different from the above prior art.

SUMMARY OF THE INVENTION

The present invention, therefore, solves the aforementioned technical problem It is a general object of the present invention to provide a process and an apparatus for making a substrate of a discrete element, which prevents a wafer from waste accompanied with the removal and loss of its impurity diffusion layer and also its silicon material.

It is a further object of the present invention to provide a process for re-slicing a wafer simply and its apparatus for performing the re-slicing process.

It is another object of the present invention to provide a further improved process and its apparatus for making the same, this enabling more high grade products.

DETAILED DESCRIPTION OF THE PREFERRED EMBODIMENT

As the gist of the present invention, the process of this invention comprises providing a semiconductor wafer which has an impurity diffusion layer on both sides but without any impurity diffusion layer within its core portion, wherein re-slicing the wafer into two further pieces at almost the center portion of the thickness of wafer or just at the center of the same makes re-sliced surface as a plain surface for enabling further doping processes.

Figure 1A:
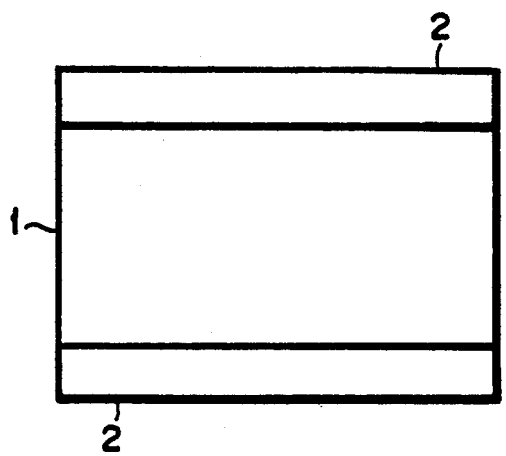
FIG. 1(A) and FIG. 1(B) are sectional views of showing a basis of the technical means of the process for re-slicing a wafer of the present invention.

In FIG. 1(A), a wafer 1 has impurity diffusion layers 2 on both sides but without the same in the core portion. Accordingly, the thickness of wafer 1 is the sum of layers 1+2+2 as shown in FIG. 1(A). This wafer 1 is provided initially in the process and apparatus of the present invention.

Figure 1B:
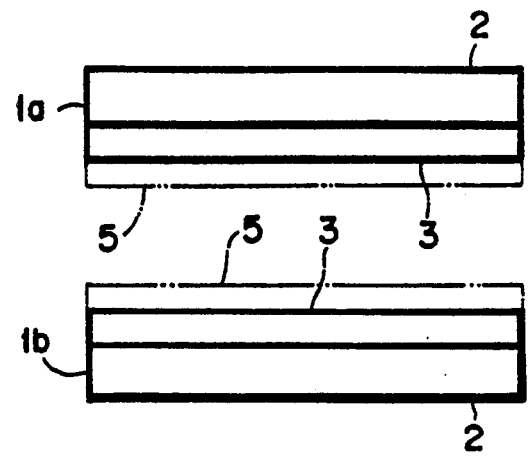

In FIG. 1(B), wafer 1 is re-sliced into two pieces as shown by 1a and 1b at almost the center or just at the center of wafer so as to make each sliced surface as a plain surface 5, which is shown by the two dot broken line in FIG. 1(B). This is known as an "as-cut wafer" in the art, and enables a further doping process and predetermined other processes such as polishing, etching, thermal treatment and inspection which are shown schematically between the reference numbers 5 and 3 as a substantial loss from the processes mentioned above, except for any kerf-loss by the slicing saw. The material of wafer 3 is a monolithic silicon ingot which is between approximately 2 inches to approximately 6 inches of diameter and/or any other diameter being possible to manufacture.

The composition of impurity diffusion layer 2 may be P(phosphorus), B(boron), Al(aluminum), Ga(gallium), As(arsenic), Sb(antimony), or the like.

Figure 2A:
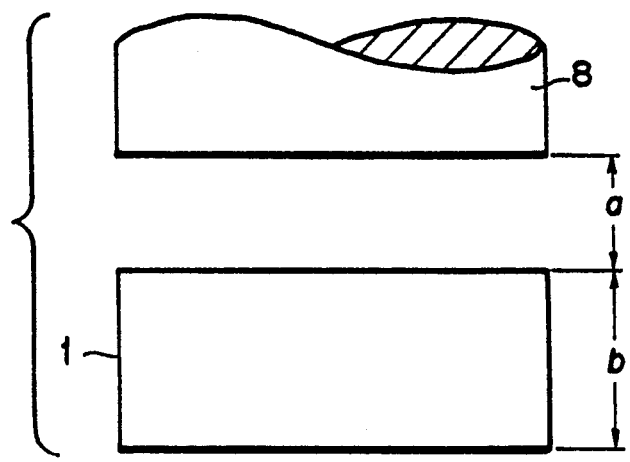
FIG. 2(A)–FIG. 2(C) are sectional views showing a rate of grind loss from single side of a wafer as shown in the prior art.
Figure 2B:
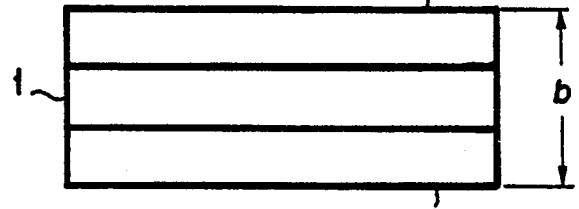
Figure 2C:
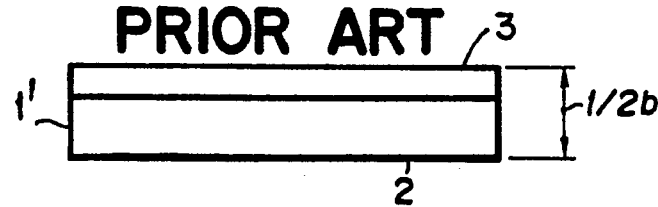

In FIG. 2 and FIG. 3, according to the above re-slicing process shown in FIGS. 1(A) and 1(B), it is noted that the impurity diffusion layers 2 on both sides are utilized intact; thus two pieces of substrate 1a, 1b for using a discrete element are obtainable from one piece of the wafer 1 with the impurity diffusion layer 2 being upon each single side respectively. As the result, an impurity diffusion layer is not removed and silicon material is not wasted from the wafer 1. Thus, the impurity diffusion layers 2 are saved intact as they were. The disadvantages involved in the conventional method is shown schematically between FIG. 2 (conventional method) and FIG. 3 (the present invention).

In the conventional method, as shown in FIG. 2(A), initially a wafer 1 having a thickness(b) is sliced from a Si-ingot 8 and includes a kerf-loss(a) thereto, and impurity diffusion layers 2 and 2 are processed on both sides in a doping process as shown in FIG. 2(B). In this method, it is assumed that the thickness(b) has not changed during the above processes because of a very small amount of polishing loss substantially after the completion of polishing for further doping the impurity diffusion layers 2,2 on both sides, a half thickness($\frac{1}{2}$b) for making a discrete element in the conventional method.

Figure 3A:
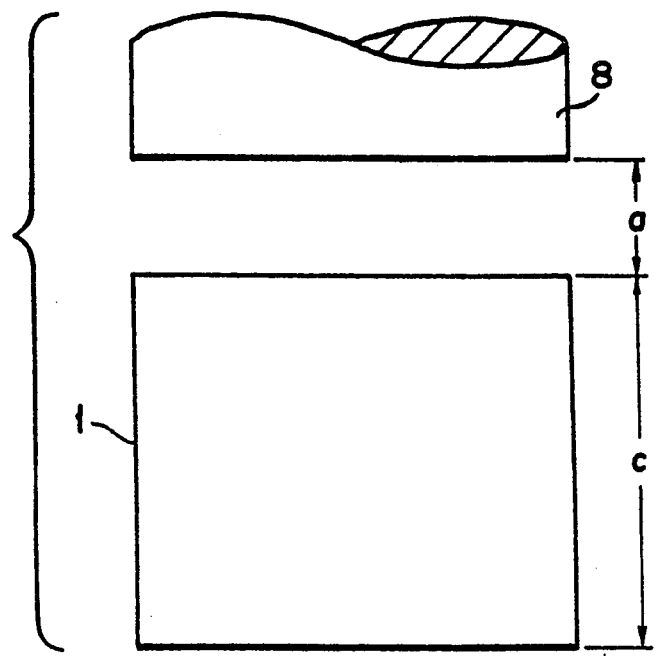
FIGS. 3(A),(B) and (C) are sectional views showing the present invention in comparison with the prior art.
Figure 3B:
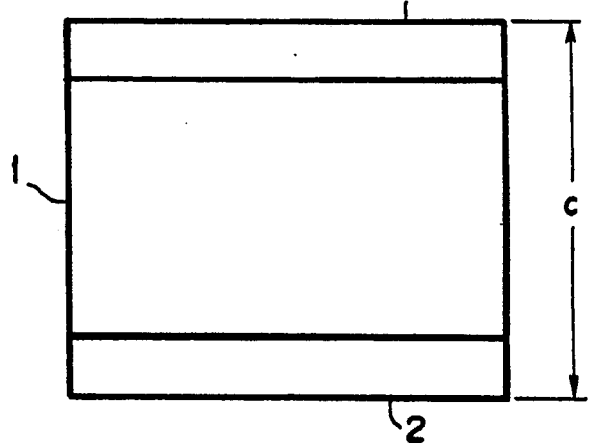

In contrast, according to the present invention and as shown in FIG. 3(A), a wafer 1 having a thickness(c) is sliced from a Si-ingot 8 with a kerf-loss(a). In FIG. 3(B) a wafer 1 having impurity diffusion layers 2 on both sides is illustrated.

Figure 3C:
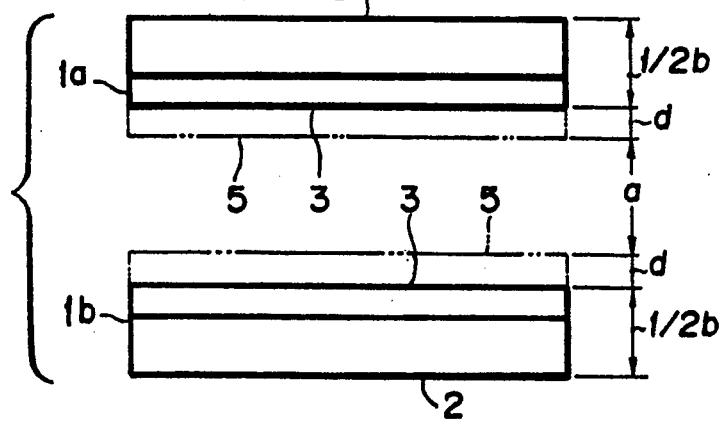

FIG. 3(C) illustrates a state in which the wafer 1 has been re-sliced into two pieces of a substrate 1a,1b. In this figure, the reference (a) is a kerf-loss when re-sliced so that its rate of kerf-loss should be same with an initial kerf-loss when sliced from the Si-ingot 8. The mark(d) is a polishing loss actually, (this loss may be considered negligible) and the mark($\frac{1}{2}$b) is the thickness of substrate 1a or 1b. From this relationship, the thickness(c) is the sum the following: $(c) = (\frac{1}{2}b) + (\frac{1}{2}b) + (d) + (d) + (a)$. Accordingly, the amount $\frac{1}{2}[(a)+(a)+(d)+(d)] = [(a)+(d)]$ of Si-material will be lost in order to obtain one piece of discrete element 1a or 1b which has a thickness ($\frac{1}{2}$b).

In the above loss (that is $[(a)+(d)]$), however, the value of (d) is negligible substantially due to being a very small amount. In contrast, the conventional loss is $[(a)+(\frac{1}{2}b)]$ per one piece of substrate 1a,1b. According to this comparison, therefore, it is obvious that the present invention can save not only Si-material per s but also steps in manufacturing. In practice, for example, the thickness of wafer 1 is approximately 0.9 mm to 1.1 mm(millimeter) per each piece and also the thickness of substrate 1a,1b is approximately 200 $\mu$m to 350 $\mu$m(micron, i.e. 0.2 mm to 0.35 mm) per each piece after the completion of all necessary processes.

Referring now in detail to the practice according to the present invention, initially a wafer 1 is provided from a Si-ingot 8 with a necessary thickness (c) to be re-sliced later in a re-slicing process. Then, the wafer is treated by doping an impurity diffusion layer on both sides through the other various processes as described previously, wherein it is transferred to the location for re-slicing sections which is an important aspect of the present invention and the transportation is performed by a so-called "cassette load wafer transfer system". The inserting operation of an unprocessed wafer 1 is also performed by a so-called "cassette insertion system" in combination with a "single wafer transfer system" which are specifically improved for the present invention. In order to achieve the process and apparatus of the present invention, the improvement was very important.

Figure 4:
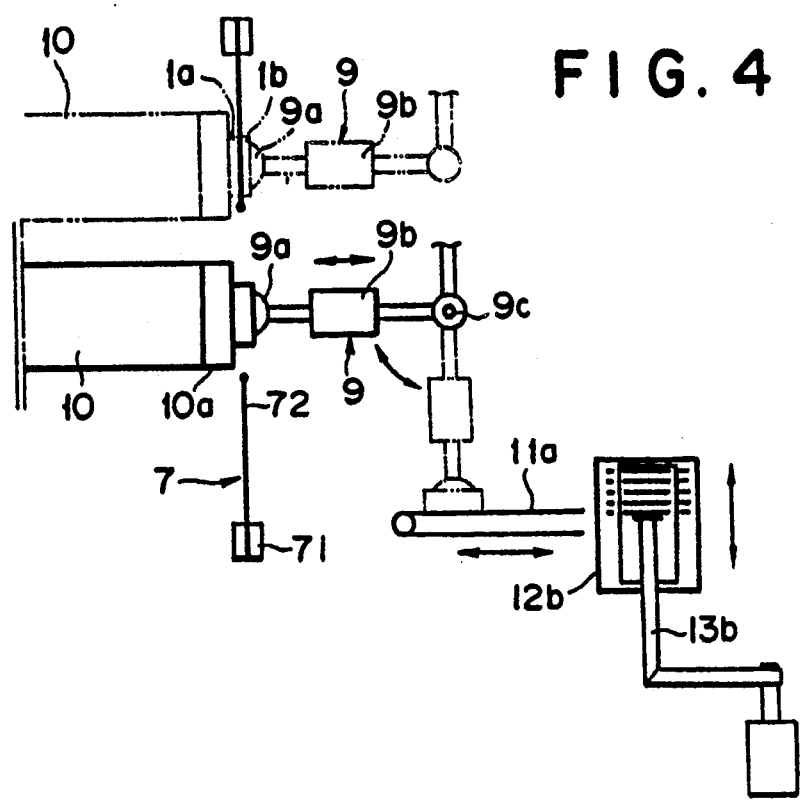
FIG. 4 is a side elevation showing a process and apparatus of the present invention.
Figure 5:
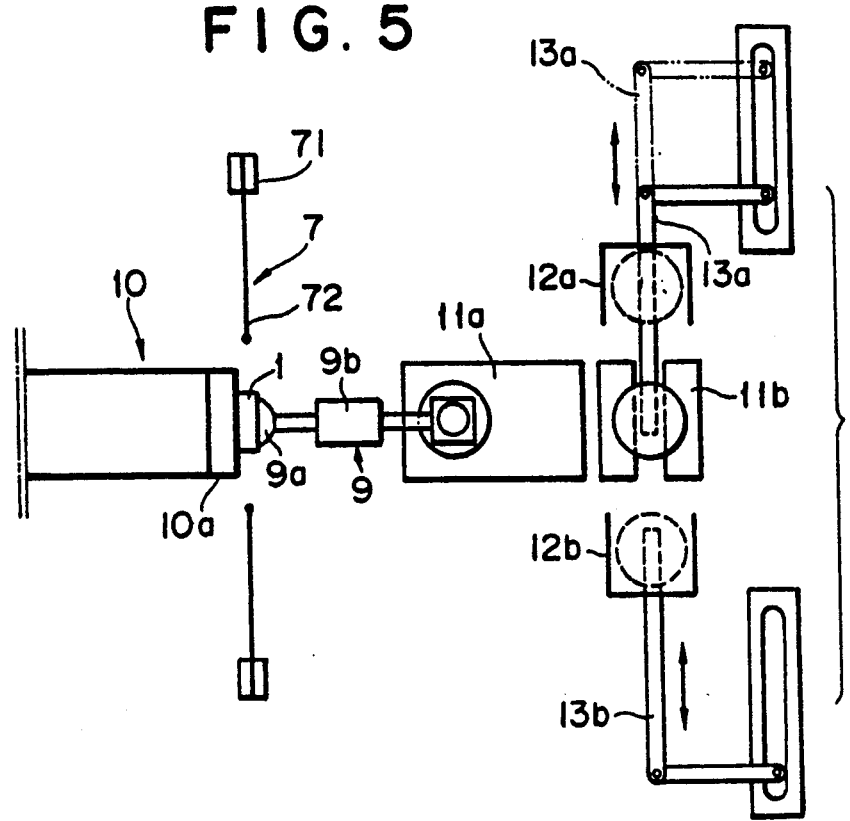
FIG. 5 is a plan view of FIG. 4.

In FIG. 4, and FIG. 5, the above mentioned improvement for a cassette insertion system in combination with a single wafer transfer system and a re-slicing system is disclosed. These systems are defined and designated as a "re-slicing apparatus" in the present disclosure, and are described as follows:

Basically, the re-slicing apparatus comprises four mechanisms, that is, a cassette inserter comprising an unprocessed-wafer cassette 12a, a wafer inserter 13a with a vacuum pad on the end of an arm and a processed-wafer cassette 12b with a wafer inserter 13b having a vacuum pad on the end of an arm. Secondly, a track system includes a roller track 11b and a belt track 11a. Thirdly, a loading system includes a robotic loader 9, a telescopic mechanism 9b, a rotary mechanism 9c and a vacuum pad 9a. Fourthly, a re-slicing system includes a movable mounting-block mechanism 10, a vacuum chuck 10a, and a stationary slicing machine 7 having an ID saw 72.

The mechanical function of each constituent element referred to above is described in detail as follows: Firstly, the so-called "cassette-to-cassette system" includes a plurality of unprocessed wafers 1 stored in the unprocessed-wafer cassette 12a as shown in FIG. 5. One piece of unprocessed wafer 1 is caught by the inserter's vacuum pad at the bottom and inserted on the roller track 11b by the action of wafer inserter 13b and is placed on the belt track 11a to transfer it to a predetermined pick-up position. In the wafer inserting operation, a processed wafer 1 is sent back through these tracks means 11a, 11b after the completion of re-slicing process, wherein the processed wafer 1 sent back to the roller track 11b is further inserted into the processed-wafer cassette 12b by the wafer inserter 13b with the vacuum pad being applied to the bottom of wafer 1.

Referring to the loading system, the wafer 1 is positioned at a predetermined position on the belt track 11a. The loader's arm 9 with the vacuum pad 9a bends down vertically as in a deep bow by the rotary mechanism 9c and the vacuum pad 9a is positioned on the top of unprocessed wafer 1 with some clearance therebetween. The vacuum pad 9a then descends and catches the unprocessed wafer 1 by the action of telescopic mechanism 9b. The loader's arm 9 with the unprocessed wafer 1 will swing up so as to be face to face with the unprocessed wafer 1 and the vacuum chuck 10a at same level by the action of rotary mechanism 9c. The telescopic mechanism 9b is actuated to press the unprocessed wafer 1 softly to the vacuum chuck 10a of movable mounting-block mechanism 10. The unprocessed wafer 1 is securely held by the vacuum chuck 10a and the suction of vacuum pad 9a of robotic loader 9 is stopped temporarily during the re-slicing process. The robotic loader 9 remains at the same position after the delivery, and will follow in response to the upward movement of movable mounting-block mechanism 10 with vacuum pad 9a being temporarily released, because the vacuum pad 9a must follow the movement of unprocessed wafer 1 during the re-slicing operation, and again catch a half part of re-sliced wafer 1 at a predetermined time before the completion of re-slicing operation.

Upon the completion of re-slicing work, the unprocessed wafer 1 has been re-sliced into two pieces of a processed wafer. In this regard, one piece of the processed wafer is designated as a substrate 1a,1b hereinafter in the disclosure. A substrate 1b is held by the vacuum pad 9a of robotic loader 9 upon the completion of re-slicing work, and then it swings down to the belt tack 11a as described previously with regard to the transportation. On the other hand, the other substrates 1a remains at the vacuum chuck 10a as it was after the release of substrate 1b from the vacuum chuck 10a. The recovery of substrate 1a will be described later in the re-slicing process.

Lastly, the re-slicing process and the apparatus are illustrated with reference to FIG. 4 and FIG. 5. The re-slicing work will be started at the point when the unprocessed wafer 1 has been delivered to the vacuum chuck 10a of the movable mounting-block mechanism 10 from the robotic loader 9. Referring to the relationship of movement between the movable mounting-block mechanism 10 and the re-slicing machine 7, it is noted that the movable mounting-block mechanism 10 moves towards the ID saw 72 of re-slicing machine 7 which is stationary. The mounting-block mechanism 10 is arranged in a transverse direction with the re-slicing machine 7, and is driven by an elevating mechanism (not shown in the drawings).

Upon acceptance of the unprocessed wafer 1 from the robotic loader 9, the mounting-block mechanism 10 with the wafer 1 starts to move upwardly while detecting the blade edge of ID saw 72, which is annular shaped and framed within a tension head 71, by assistance of an automatic sizing machine so as to concentrate at the center portion of a wafer's core thickness mostly or just at the center portion of the wafer. The blade edge of the ID saw includes a blade core bonded with superhigh-hardness type abrasive grains such as an industrial diamond or the like, which rotates at a predetermined speed. On the end of the mounting-block mechanism 10, a vacuum chuck 10 is disposed, which is made of porous type ceramics or the like and communicates pneumatically with a vacuum pump through a vacuum passage. The mounting block mechanism 10 is arranged at a predetermined position based on the center of the opening of the ID saw as its reference level, and is elevated automatically. As shown by the two dot broken line of FIG. 4, the mounting-block mechanism 10 is elevated and, according to the elevation, the unprocessed wafer 1 (shown by a solid line) is re-sliced into two substrates 1a,1b (shown by a two dot broken line). The substrate 1b is caught again by the vacuum pad 9a which has followed continuously in response to the upward movement of the mounting-block mechanism 10 with the unprocessed wafer 1 during the re-slicing operation. On the way to the completion of the re-slicing operation, the vacuum pad 9a will initiate a vacuum for catching the substrate 1b. The mounting-block mechanism 10 with the substrate 1a is returned to the reference level and releases the substrate 1a to the vacuum pad 9a of the robotic loader 9, wherein the robotic loader 9 with the substrate 1a will swing down to the belt track 11a and release the substrate 1a on the belt track 11a. The substrate 1a is further transferred to the roller track 11b and relayed to the wafer inserter 13b and stored in the processed wafer cassette 12b. Upon acceptance of the substrate 1a, the processed wafer cassette 12b will rise slightly with one pitch, which is a fraction equivalent to the thickness of one piece for further acceptance of next substrate. During these downstream operations, the robotic loader 9 repeatedly moves again for the next unprocessed wafers.

It will be recognized that there are other equivalent ways of achieving the process and the apparatus of the present invention. For example, two belt track systems 11a may be provided in order to enhance the working speed of transportation although one belt track 11a is used in the above practical example. In addition, two systems of the robotic loader 9 may be provided for recovering the substrates 1a,1b for enhancing the working speed. Further, relationship of movement between the movable mounting-block mechanism 10 and the re-slicing machine 7 may also be changed; that is, a stationary mounting-block mechanism 10 and a movable re-slicing machine 7 may be provided.

In addition, a very important other process will be specifically described which relates to a practical example concerning "a slice base". Generally, the slice base is attached with an Si-ingot prior to a slicing process in order to fix each sliced wafer, (similar to a comb in the side view), on the orientation flat, after being sliced. After that, a number of wafers and the slice base are separated in a chemical solution.

Figure 7A:
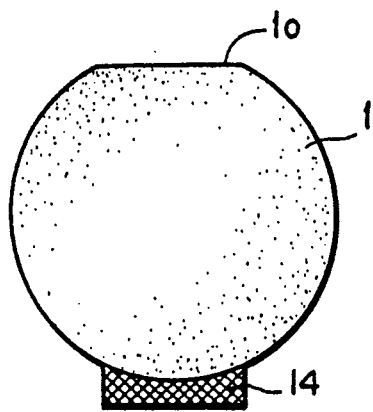
FIG. 7(A) is a front elevation showing a fixing position and structure of a slice base to fix the wafer of the present invention.
Figure 7B:
FIG. 7(B) is a side view of FIG. 7(A)
Figure 8A:
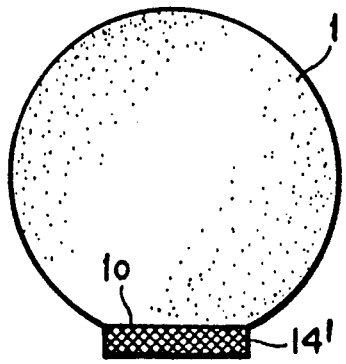
FIG. 8(A) is a front elevation showing a fixing position and structure of a slice base to fix the wafer of another practical example.
Figure 8B:
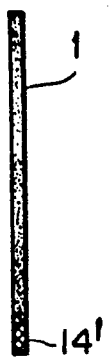
FIG. 8(B) is a side elevation of FIG. 8(A)
Figure 9:
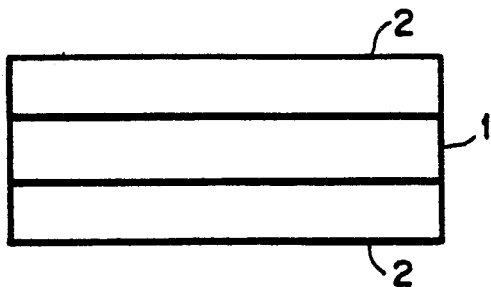
FIG. 9 to FIG. 11 are a sectional views of a wafer showing a process of the prior art.
Figure 10:
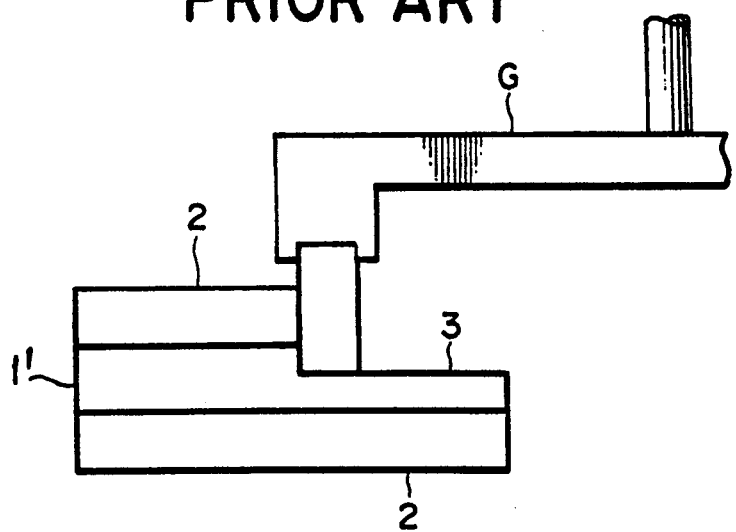
Figure 11:
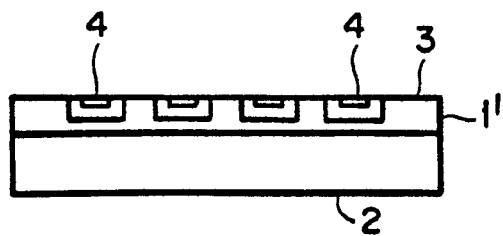

In FIG. 7 and FIG. 8, however, a wafer 1 having a chip of slice base 14 adhered subsequently or prior to the re-slicing process is provided. That is, in one example, "twin-type" substrates 1a,1b are adhered to chip 14' at an orientation flat 1o after the completion of a re-slicing process in FIGS. 8(A) and 8(B).

The other example of the present invention will now be described. As a different feature from the initial example, it is noted that a twin-type substrate is obtainable and a stationary robotic loader 9 is available, because if the twin-type substrate could be obtained, it is no longer necessary that the robotic loader 9 move together with the movable mounting-block mechanism 10 for catching a half part of re-sliced wafers 1a,1b. The above two points are different from the initial example but the remaining features are the same with the initial, so that same reference numbers are used in FIGS. 6 to 8 and any specific explanation for such features will be omitted hereinafter.

In FIG. 7 and FIG. 8, a slice base 14, 14' is made from carbon or silicon or the like, and the base 14 adheres to an opposite edge of an orientation flat 1o in FIG. 7, or the base 14' alternately being adhered to the orientation flat 1o in FIG. 8. The adhesion operation of base 14,14' to the unprocessed wafer 1 is performed automatically.

Figure 6:
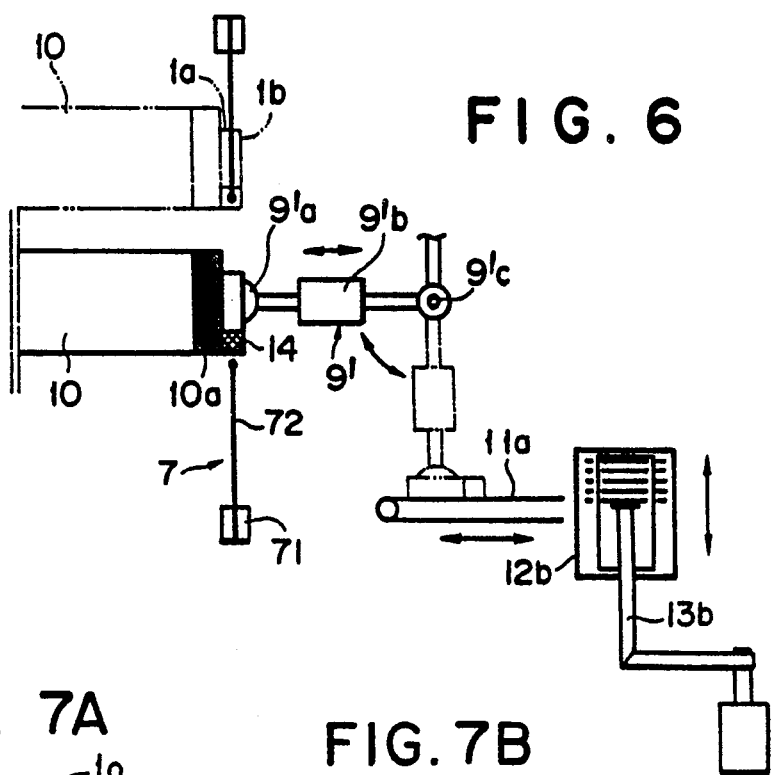
FIG. 6 is a side elevation for showing an apparatus of the present invention.

When re-slicing the unprocessed wafer 1 with the base 14,14', the center of the wafer's core thickness is detected first by an automatic sizing machine, wherein the unprocessed wafer 1 is re-sliced but remains connected to the bottom of base chip 14,14'. This feature is illustrated in FIG. 6. As shown in the drawings, firstly, the robotic loader 9 catches an unprocessed wafer 1 and swings up to deliver the wafer 1 to the vacuum chuck 10a. When the wafer 1 has been caught by the vacuum chuck 10a, the vacuum action of vacuum pad 9a of robotic loader 9 is stopped until the completion of the re-slicing operation. The robotic loader 9 stays at the same stationary position and only the movable mounting-block mechanism 10 moves upwardly towards the ID saw and the re-slicing operation is finished. This feature is illustrated by the two dot broken line in FIG. 6.

The re-sliced wafers, that is, the two substrates 1a,1b are held intact by the vacuum chuck 10a and they are returned to the original position where the robotic loader 9 is ready to catch them again, wherein the stationary robotic loader 9 will return them to the belt track 11a when they are together.

According to this practical example as shown in FIGS. 6 to 8, it is advantageous in that an unprocessed wafer 1 with a base 14, 14' is reslited partially towards the bottom of the base, so that any end chipping damage of the wafer which occurs sometime in slicing work owing to the existence of the slice base adhered to the wafer is prevented. Therefore high quality products, a high productive yield, and an improvement of productivity are attained. In addition, since these substrates 1a,1b are incorporated together on the slice base, no necessity of providing two recovery systems for transportation is required, which can simplify the structure of the recovery means and its attachments, thus providing an apparatus having a simple structure.

In addition, in the aforementioned practical examples, the processes for re-slicing a wafer from one end to the other end by moving either the mounting-block mechanism or the re-slicing machine selectively in up and down directions is possible. The direction of movement of the mounting-block mechanism or re-slicing the wafer determines the relative direction for re-slicing the wafer. Therefore, the direction of movement is not limited to the up and down directions but may include other directions, such as an oblique direction, a horizontal direction, or a circular arc direction, if such a direction is able to allow re-slicing of the wafer.

It is to be understood that the present invention is not limited in its application to the details of construction and arrangement of parts illustrated in the drawings.

What is claimed is:

1. A process for making a substrate of a semiconductor for use as a discrete element from a wafer including opposed surfaces, edges, and a core portion, comprising the steps of:

providing said wafer having impurity diffusion layers on both surfaces of said wafer but not containing any impurity diffusion layer in the core portion of said wafer;

adhering a slice base to a first portion of said edge surface of said unprocessed wafer;

holding one side of said unprocessed wafer by a vacuum means;

loading said unprocessed wafer with said slice base into a re-slicing machine provided to rotate a slicing saw at a predetermined speed and at predetermined position;

re-slicing said unprocessed wafer together with said slice base into two pieces by starting to re-slice said wafer from a second portion of said edge surface which is opposed to said first portion, at substantially the center of the core thickness by said re-slicing machine, by holding an opposed side of said one side of said unprocessed wafer by another vacuum means before finishing re-slicing said slice base;

whereby a surface of said re-sliced wafer having a plain surface without any impurity diffusion layer, and the other surface having an impurity diffusion layer are formed.

2. A process as claimed in claim 1, comprising the steps of:

providing an impurity in said impurity diffusion layer, wherein said impurity is selected from the group consisting of phosphorus, boron, aluminum, gallium, arsenic, and antimony.

3. A process as claimed in claim 1, comprising the steps of:

providing a re-slicing position of said wafer to be at the center of core thickness.

4. A process as claimed in claim 1, comprising the steps of:

providing said wafer which is a silicon wafer with said core thickness being between approximately 0.9 mm and approximately 1.1 mm before being re-sliced.

5. A process for making a substrate of a semiconductor for use as a discrete element from a wafer including opposed major surfaces, edge surfaces, and a core portion, comprising the steps of:

bonding a slice base to a first portion of an edge surface of said wafer which has impurity diffused layers on both opposed major surfaces; and holding a single major surface of said wafer;

re-slicing said wafer into two pieces from a second portion of an edge surface of said slice base toward said first portion at substantially the center of core thickness by a re-slicing machine having a saw which rotates at a high speed so that said saw cuts at least as far as said slice base, wherein said wafer is re-sliced into two elements.

6. A process as claimed in claim 5, comprising the steps of:

providing vacuum holding means to hold said wafer.

7. A process as claimed in claim 5, comprising the steps of:

providing an impurity in said impurity diffusion layer, wherein said impurity is selected from the group consisting of phosphorus, boron, aluminum, gallium, arsenic, and antimony.

8. A process as claimed in claim 5, comprising the steps of:
providing said re-slicing position of said wafer to be at the center of core thickness.

9. A process as claimed in claim 5, comprising the steps of:
providing said wafer which is a silicon wafer with said core thickness being between approximately 0.9 mm and approximately 1.1 mm before being re-sliced.

10. A process as claimed in claim 1, further comprising the step of:
forming said plain surface of said re-sliced wafer to be suitable for doping a new impurity diffusion layer.

* * * * *